(12) United States Patent
Langberg et al.

(10) Patent No.: US 6,327,666 B1
(45) Date of Patent: Dec. 4, 2001

(54) SYSTEM AND METHOD FOR EXTERNAL TIMING USING A COMPLEX ROTATOR

(75) Inventors: Ehud Langberg, Ocean Township; Richard Gut, Red Bank; Chenshu Wang, Ocean, all of NJ (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/014,155

(22) Filed: Jan. 27, 1998

(51) Int. Cl.$^7$ .................................. G06F 1/04; G06F 1/12
(52) U.S. Cl. ......................... 713/400; 713/501; 713/503
(58) Field of Search ................................. 713/400, 500, 713/501, 503

(56) References Cited

U.S. PATENT DOCUMENTS

| | | | |
|---|---|---|---|
| Re. 034,206 | * 3/1993 | Sayar | 375/20 |
| 5,446,767 | * 8/1995 | Nakagawa et al. | 375/376 |
| 5,500,874 | * 3/1996 | Terrell | 375/232 |
| 5,805,619 | * 9/1998 | Gardner et al. | 714/814 |
| 5,898,744 | * 4/1999 | Kimbrow et al. | 375/376 |

* cited by examiner

Primary Examiner—Dennis M. Butler
(74) Attorney, Agent, or Firm—Thomas, Kayden, Horstemeyer & Risley

(57) ABSTRACT

An improvement to system timing and synchronization in a digital transceiver allows the synchronization of a transceiver located at a central office to a network or system clock without the use of any additional transmitted bits or additional external circuitry. The system allows a transceiver to achieve timing and synchronization lock to a system master clock, such as a T1 or E1 clock, by operating on the two level input clock with a complex rotator to develop an error signal which allows a phase locked loop circuit to drive a frequency synthesizing device, which in turn drives a system clock. The system clock provides an input to a complex generator, which in turn develops a complex rotation function. The complex rotation function allows the transceiver clock to synchronize to the network master clock.

16 Claims, 7 Drawing Sheets

External Timing Without External Circuitry

External Timing Without External Circuitry

External Timing using an external N/D multiplier

External Timing using an external divider

SYSTEM AND METHOD FOR EXTERNAL TIMING USING A COMPLEX ROTATOR

FIELD OF THE INVENTION

The present invention relates generally to data communications, and more particularly, to a system and method for achieving timing synchronization by providing external timing using a complex rotator.

BACKGROUND OF THE INVENTION

In the field of data communications a transceiver, or modem, is used to convey information from one location to another. Digital Subscriber Line (DSL) technology now enables transceivers to communicate rapidly large amounts of data. Transceivers communicate by modulating a baseband signal carrying digital data, converting the modulated digital data signal to an analog signal, and transmitting the analog signal over a conventional copper wire pair using techniques that are known in the art. These known techniques include mapping the information to be transmitted into a multi-dimensional multilevel signal space constellation and slicing the received constellation to recover the transmitted information. The constellation can include both analog and digital information or only digital information.

In the above mentioned communications environment, a control transceiver is located at a telephone company central office location. Connected to the transceiver via a conventional copper wire pair is a remote transceiver. The remote transceiver resides at a location, such as a residence or a business location. Before the central office transceiver can exchange information with the remote transceiver, clock timing and synchronization between the central office transceiver and the network master clock must be established.

Timing and synchronization are fundamental to any digital transmission and switching network. In a digital transmission system, timing is encoded with the transmitted signal using the network master clock, such as a T1 or E1 clock. As such, the central office transceiver must recover system timing and synchronization from this system clock. Once frequency synchronization between the central office transceiver and the network clock is achieved, the receiver in the transceiver can identify frame boundaries of the receive and transmit data signal.

In the aforementioned communications environment, synchronization is provided in a master-slave relationship such that the network, T1 for example, timing is at the highest level allowing it to provide timing to all transmission systems that are connected to the network. Each transceiver connected to the network must be synchronized to the network system clock.

A common technique for achieving timing synchronization between the network clock and the central office transceiver is based upon the use of an external framer which performs bit/pulse stuffing. In this arrangement the aggregate bit stream has a higher data rate than the input data rate from the network. This arrangement allows the accommodation of additional stuffing and framing bits. The stuffing bits are inserted or deleted in the incoming data stream until the clock rate is equal to that of the input rate, or its frequency is locked to the system clock. The stuffed bits are inserted at fixed locations of each frame so that they can be identified and removed at the remote transceiver. Unfortunately, this technique requires the use of additional bits that consume bandwidth and reduce the aggregate data rate.

Another known technique for achieving network timing synchronization is to lock the central office transceiver to the system clock using a voltage controlled oscillator (VCO) in conjunction with a phase locked loop (PLL). In this arrangement, timing lock is achieved by tuning the local frequency of a VCO using an additional phase and frequency measurement circuit that adjusts the transceiver reference frequency to lock a local reference clock to the system clock. This is achieved by measuring the offset between the system clock and a reference clock in order to develop an error signal to supply to the PLL which in turn drives the VCO. This technique uses additional circuitry that adds system cost and complexity.

Thus, it would be desirable to allow a central office transceiver to achieve timing lock and synchronization to a system clock without the need to transmit additional bits or without requiring costly additional circuitry.

SUMMARY OF THE INVENTION

The present invention provides an improvement to synchronizing the clock of a transceiver to a network system clock by allowing the transceiver to synchronize to the network system clock without the use of any external framing or circuit componentry.

This task is accomplished by providing a system for providing external timing which includes a filter configured to receive a sampled clock signal input and to provide a two dimensional multilevel signal output. This two dimensional multilevel signal output is then supplied to a demodulator configured to multiply the two dimensional multilevel signal output with a complex rotation signal and provide an output in the form of a phase error signal. The phase error signal is then supplied to a loop filter configured to operate on the error signal to develop and output a real voltage signal to a frequency synthesizing device. The frequency synthesizing device is configured to supply its output to the system clock. The system clock supplies a signal to a complex generator which outputs the complex rotation signal. The complex rotation signal is designed to control the demodulator such that the resultant error signal output from the demodulator provides information regarding the rotation of the clock signal. The system clock is also configured to output the signal used to drive the sample rate of the input clock and a baud clock signal, which is at the desired rate to enable timing synchronization between the transceiver and the system clock.

In a first alternate embodiment, a bit rate multiplier configured to multiply the input clock signal to an integer ratio of the input clock is included. In a second alternate embodiment, a divider configured to divide the input clock signal to a rate proportional to that of the input clock is included.

The present invention also provides a method for providing external timing by supplying to a filter a sampled clock signal input. The filter is configured to receive the sampled clock signal input and to provide a two dimensional multilevel signal output. The clock signal input is sampled at a particular rate determined by a sampling signal developed by the invention. The two dimensional output of the filter is demodulated with a complex rotation signal resulting in a phase error signal output. The phase error signal is supplied to a loop filter resulting in a real voltage output. The real voltage output of the loop filter is supplied to a frequency synthesizing device, which in turn supplies its output to the system clock. The system clock supplies a signal to a complex generator which outputs a complex rotation signal. The complex rotation signal controls the demodulator, thus providing the error signal output. The system clock develops the sampling clock signal, which is used to sample the input clock signal prior to the complex filter and also provides the baud clock signal, which is at the desired rate to enable timing synchronization between the transceiver and the system clock.

In a first alternate embodiment, a multiplier configured to multiply the input clock signal to a rate proportional to that of the input clock is included. In a second alternate embodiment, a divider configured to divide the input clock signal to a rate proportional to that of the input clock is included.

The invention has numerous advantages, a few of which are delineated hereafter, as merely examples.

An advantage of the present invention is that it eliminates the need to send additional stuffing and framing bits to synchronize the transceiver clock to the system clock.

Another advantage of the invention is that it can be implemented completely within a digital signal processor (DSP).

Another advantage of the invention is that it can be adapted to work on a wide range of system clock speeds and ratios.

Another advantage of the present invention is that it eliminates the need for additional circuitry to measure a frequency offset in order to synchronize the transceiver to the system clock.

Another advantage of the invention is that it allows the use of a low sampling rate to represent a high speed input clock signal, thus conserving system resources.

Another advantage of the present invention is that it is simple in design, reliable in operation, and its design lends itself to economical mass production in modems.

Other features and advantages of the present invention will become apparent to one with skill in the art upon examination of the following drawings and detailed description. It is intended that all such additional features and advantages be included herein within the scope of the present invention, as defined in the appended claims.

For example, while the foregoing has been described using a T1 master clock input, any network master clock signal can be used as input to the present invention with similar results.

BRIEF DESCRIPTION OF THE DRAWINGS

The present invention, as defined in the claims, can be better understood with reference to the following drawings. The components within the drawings are not necessarily to scale relative to each another, emphasis instead being placed on clearly illustrating the principles of the present invention.

DETAILED DESCRIPTION OF THE PREFERRED EMBODIMENT

The present invention can be implemented in software, hardware, or a combination thereof. In the preferred embodiment, the elements of the present invention are implemented in software that is stored in a memory and that configures and drives a suitable digital signal processor (DSP) situated in a transceiver. However, the foregoing software can be stored on any computer-readable medium for transport or for use by or in connection with any suitable computer-related system or method. In the context of this document, a computer-readable medium is an electronic, magnetic, optical, or other physical device or means that can contain or store a computer program for use by or in connection with a computer-related system or method.

While the foregoing preferred embodiment illustrates the invention in the context of a digital subscriber line (DSL) transceiver, the features of the present invention are applicable to any master-slave timing application where any device synchronizes its timing to the timing of a master clock.

Figure 1:
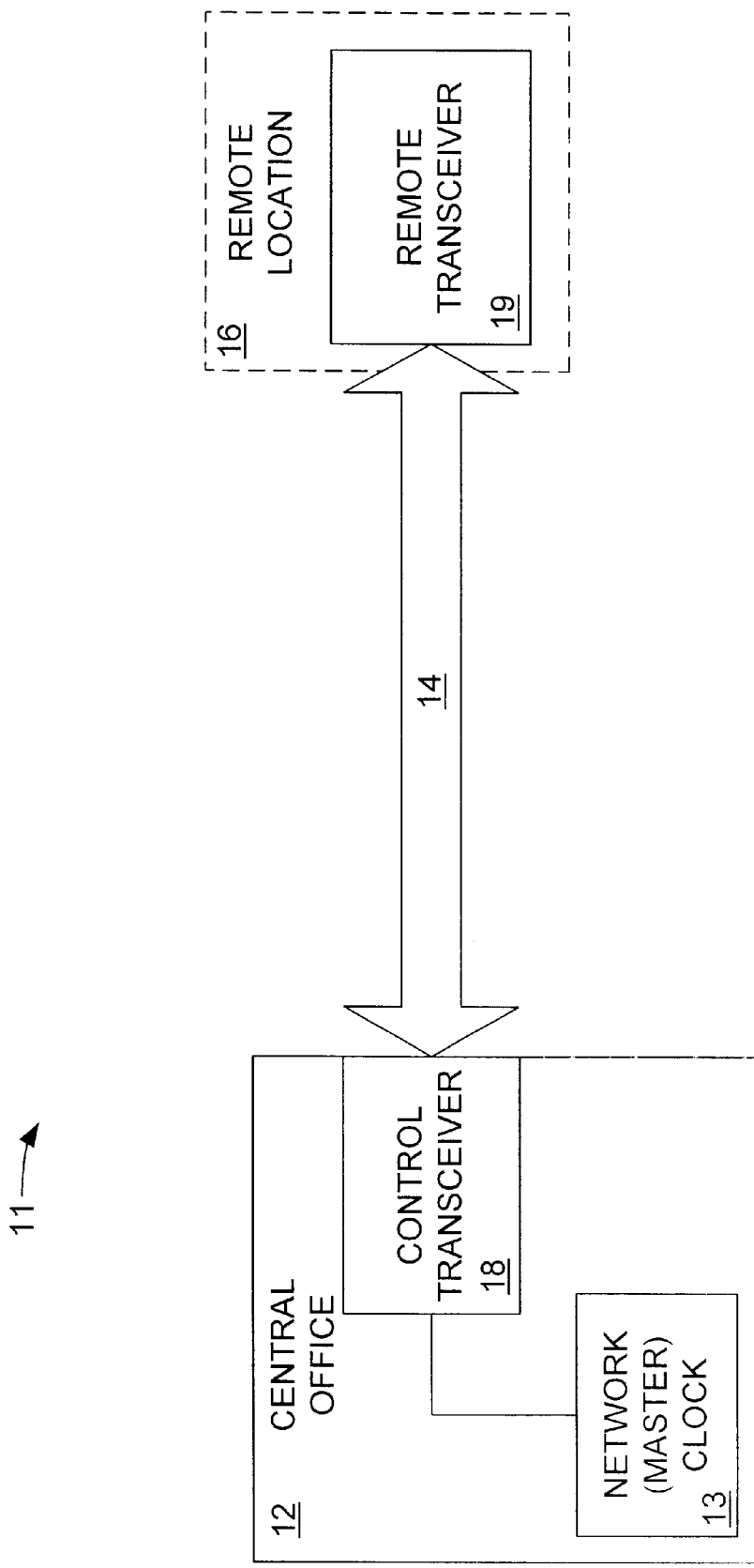
FIG. 1 is a schematic view of a communications network including a central office control transceiver embodying the concepts of the present invention.

Referring now to FIG. 1, shown is a schematic view illustrating a DSL communications environment 11 in which a control transceiver 18 employing the concepts and features of the present invention is used. Remote location 16 is connected to central office location 12 via communications channel 14. Located at central office location 12 is control transceiver 18 and network (master) clock 13. Network clock 13 can be for example generated by a T1 transmission channel, however, any network clock can be used as input to control transceiver 18 to practice the concepts and features of the present invention. Communication channel 14 is typically the copper wire pair that runs between a telephone company central office and a remote residential, business, or any other location. Remote location 16 contains remote transceiver 19 connected to control transceiver 18 via communication channel 14. Remote location 16 can be a residential, business, or any other location served by conventional copper wire pair. By using control transceiver 18 employing the concepts and features of the present invention, it is possible for control transceiver 18 to derive timing and synchronization information from, and synchronize to, network master clock 13 without the need for any additional circuitry or the need to transmit any additional bits.

Figure 2:
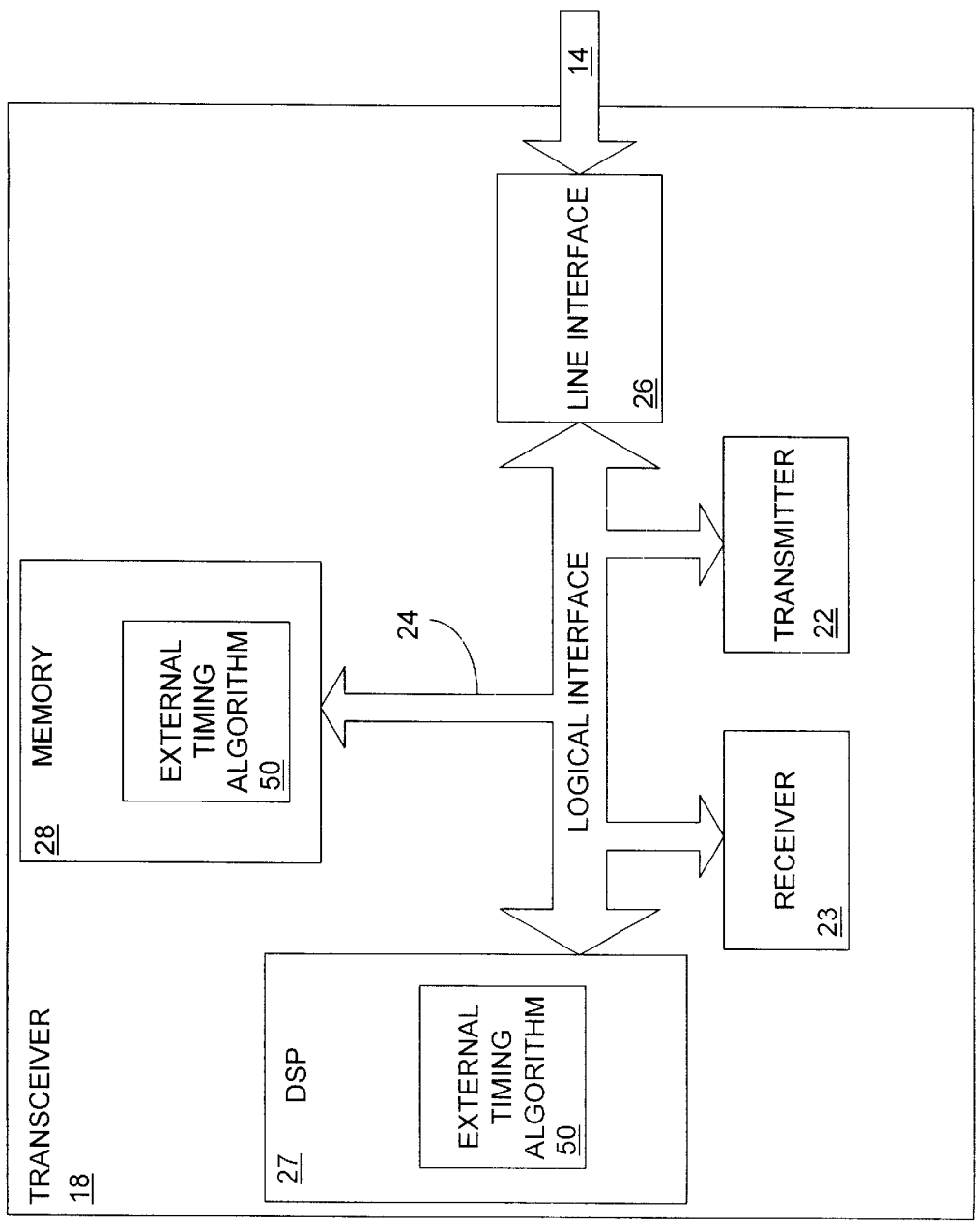
FIG. 2 is a schematic view illustrating a transceiver of FIG. 1 including the external timing algorithm of the present invention.

Now referring to FIG. 2, shown is a schematic view illustrating control transceiver 18 of FIG. 1 including the concepts of the present invention. Control transceiver 18 contains conventional components as is known in the art of data communications. Digital signal processor (DSP) 27 coordinates the operation of the modems transmitter 22 and receiver 23 through logical interface 24, and couples to line interface 26 to gain access to communications channel 14. Communications channel 14 can be the copper wire pair that connects a telephone company central office to a remote used location such as a home or business location. Also included in transceiver 18 is memory 28 which includes the external timing algorithm 50 of the present invention. The external timing algorithm 50, which, because it is executed by DSP 27, is also depicted as residing therein, is configured to enable and drive DSP 27 in order to allow control transceiver 18 to recover timing from and synchronize to network master clock 13, such as a T1 clock, without the use of any external circuitry or the need to exchange any additional bits.

Figure 3:
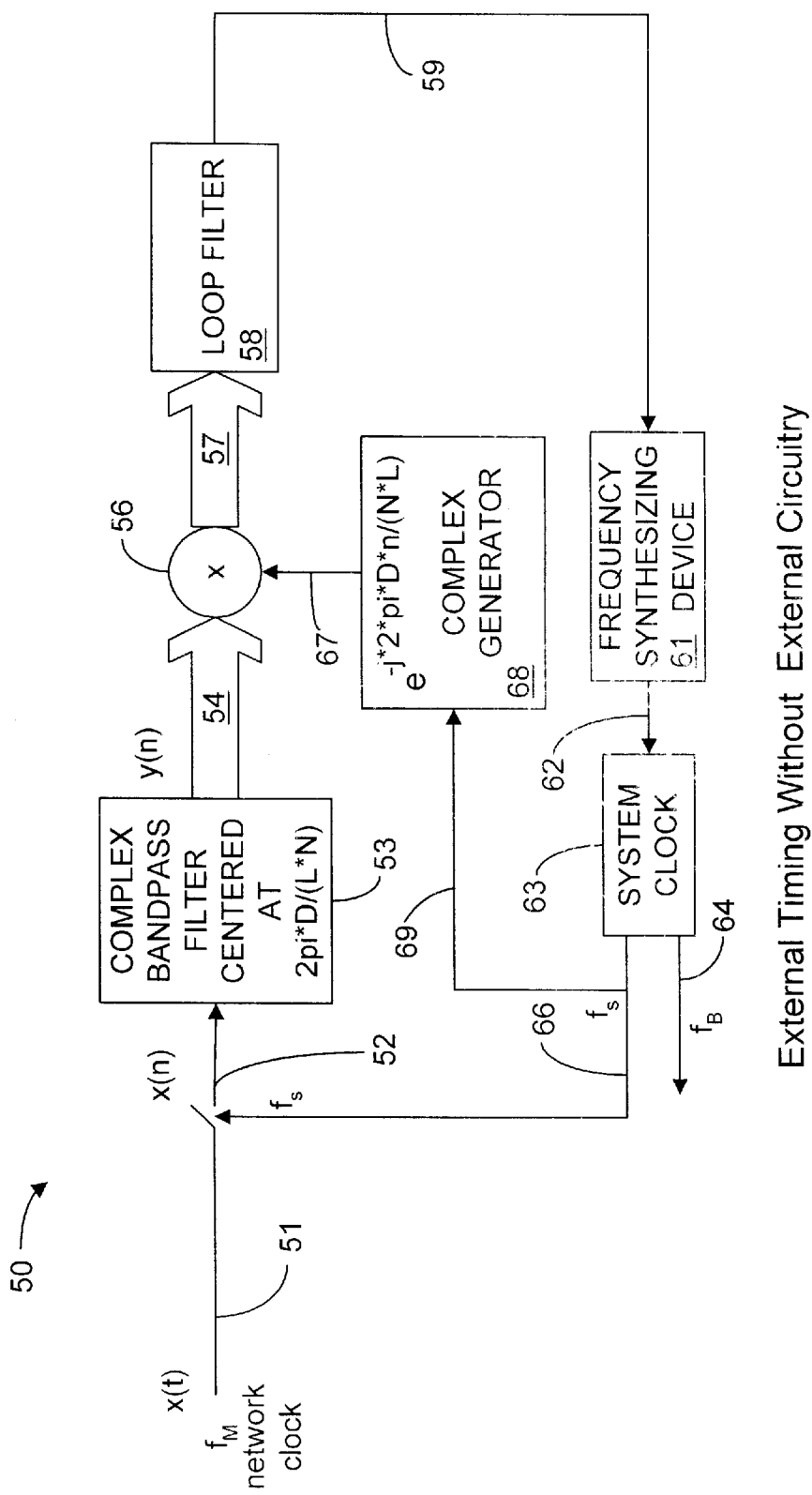
FIG. 3 is a schematic view illustrating the external timing system of the modem of FIG. 2.

With reference now to FIG. 3, shown is a schematic view illustrating the preferred embodiment of the external timing system 50 of the modem of FIG. 2 embodying the concepts of the present invention. Continuous two level binary network clock input $f_M$, which can be for example a T1 or E1 network clock or any clock derived from the network clock is represented by x(t) and is supplied on line 51 to sampler 52. The ratio between $f_B$ and $f_M$ is equal to N/D, i.e. $f_B$=N/D $f_M$, where $f_B$ is the system baud clock, N is the input clock multiplier and D is the input clock divider.

Sampler 52 samples the network clock signal on line 51 according to system sampling clock signal $f_s$ on line 66. System sampling clock signal $f_s$ on line 66 will be described in detail hereafter The output of sampler 52, or function x(n), which is the input clock signal on line 51 sampled by $f_s$ on line 66, is supplied to complex bandpass filter 53. Complex bandpass filter 53, which is a complex phase detector, operates on the sampled input clock signal to provide a two dimensional multilevel signal y(n) on line 54 and is centered at the normalized input clock frequency 2 pi*D/(L*N). The output signal y(n) on line 54 is comprised of a sin and cosine signal which represents a unique phase and level of input clock signal x(t) relative to system sampling clock $f_s$.

In many cases the network clock 13 provided by central office 12 is at a much higher rate than the system's baud clock, thus preventing a feasible sampling frequency. To solve this problem, aliasing can be used to derive a reference master clock smaller than $f_s/2$. Given a sampling clock $f_s=L*f_B$ and a master clock $f_M$, the aliased frequency, i.e., the aliased clock, will appear at $$f_M = \left| f_M - \left\lfloor \frac{f_M}{L \cdot f_B} + \frac{1}{2} \right\rfloor \cdot L \cdot f_B \right|$$

and can in the same way as the aforementioned original master clock be used to synchronize the system.

Still referring to FIG. 3, the two dimensional multilevel signal on line 54 is supplied to demodulator 56 where it is multiplied with complex rotator function $e^{-j*2*pi*D*n/(N*L)}$ supplied by complex generator 68, where N/D is the ratio between $f_B$ and $f_M$, n is the time index, and L is the number of sampling clock cycles in a singe baud. Because a non-integer relation between the network clock and the system baud clock ($f_B$) creates a frequency offset, or a constant rotation between the clocks and the system, a complex rotation function is supplied by complex generator 68 on line 67 to demodulate to the baseband the complex output y(n) on line 54 from complex bandpass filter 53.

The complex rotator function on line 67 rotates every N bauds D times to derotate the aforementioned offset between the input clock and the system clock. The demodulated signal, or phase error signal on line 57 is then supplied to loop filter 58 which provides the real voltage input on line 59 to frequency synthesizing device 61. Illustratively, any frequency synthesizing device can be used.

The output of frequency synthesizing device 61 is supplied on line 62 to system clock 63. System clock 63 supplies system sampling clock $f_s$, which is $f_B*L$, on line 66 to drive sampler 52, and on line 69 as input to complex rotator 68. System clock 63 also supplies $f_B$, which is the system baud clock, to be used by the transceiver as is known in the art.

Figure 4:
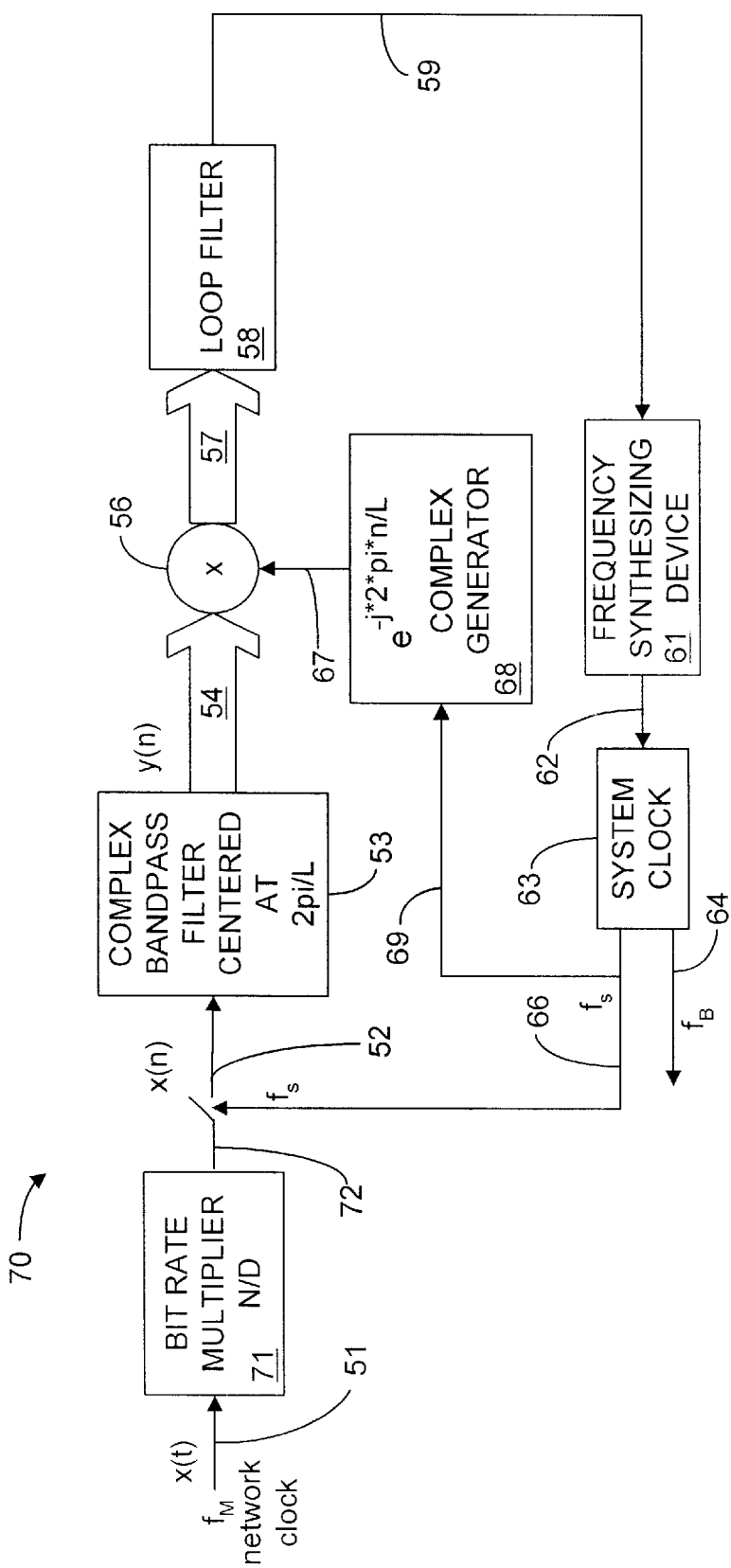
FIG. 4 is a schematic view illustrating a first alternate embodiment of the external timing system of the modem of FIG. 2.

Referring now to FIG. 4, shown is a schematic view illustrating a first alternate embodiment of the external timing system 70 of the transceiver 18 of FIG. 2. The components of this first alternate embodiment of the system and method for external timing using a complex rotator are substantially similar to that of external timing system 50 and, unless a change in operation is employed, the function of components already explained will not be repeated.

As can be seen, added to network input clock line 51 is bit rate multiplier 71. Using a known in the art N/D bit rate multiplier 71, the network input clock $f_M$ is adjusted to be in an integer relation with the transceiver baud clock $f_B$ clock. The output of bit rate multiplier 71 on line 72 becomes the network input clock $f_M$, however, as a result of the operation performed by bit rate multiplier 71, $f_M$ is now $f_M*N/D$, which is input to sampler 52 and then to complex bandpass filter 53, which in this first alternate embodiment is centered at input clock frequency 2 pi/L. Because the network input clock has changed to $f_M*N/D$, the complex rotator function on line 67 becomes $e^{-j*2*pi*n/L}$. The operation of the remaining components of the system are identical to that disclosed above with reference to FIG. 3.

Figure 5:
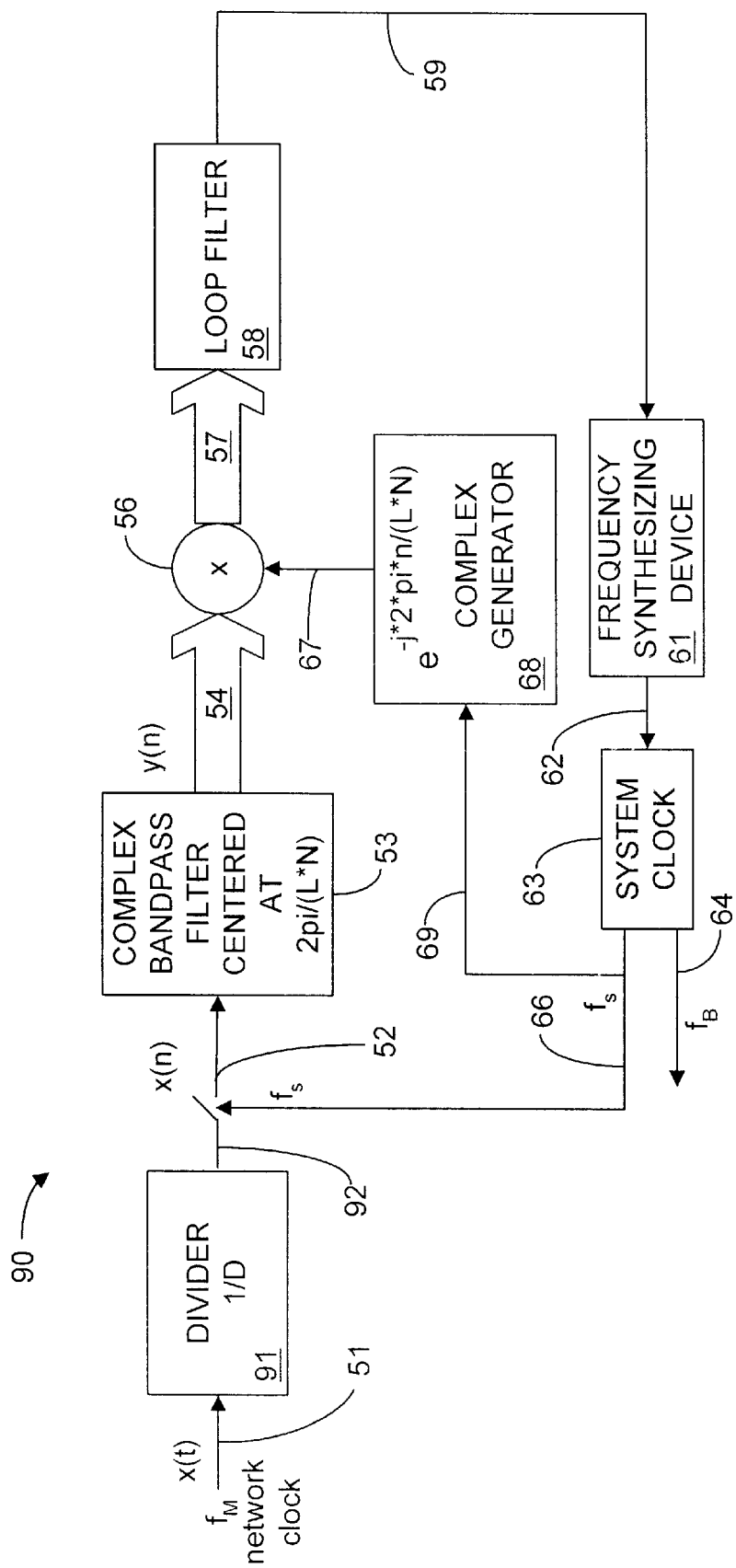
FIG. 5 is a schematic view illustrating a second alternate embodiment of the external timing system of the modem of FIG. 2.

Referring now to FIG. 5, shown is a schematic view illustrating a second alternate embodiment of the external timing system 90 of the modem of FIG. 2. The components of this second alternate embodiment of the present invention are substantially similar to that of external timing system 50 and, unless a change in operation is employed, the function of components already explained will not be repeated. As can be seen, added to network input clock line 51 is divider 91. Divider 91 generates an input clock that is integer related to the transceiver baud clock, $f_B$, by using a known in the art circuit divider. The output of divider 91 on line 92 becomes the network input clock $f_M$, however, as a result of the operation of divider 91, $f_M$ is now $f_M/D$, or fb/N, which is input to sampler 52 and then to complex bandpass filter 53, which in this second alternate embodiment is centered at input clock frequency 2 pi/(L*N). Because the network input clock has changed to $f_M/D$, the complex rotator function on line 67 becomes $e^{-j*2*pi*n/(L*N)}$. The operation of the remaining components of the system are identical to that disclosed above with reference to FIG. 3.

Figure 6:
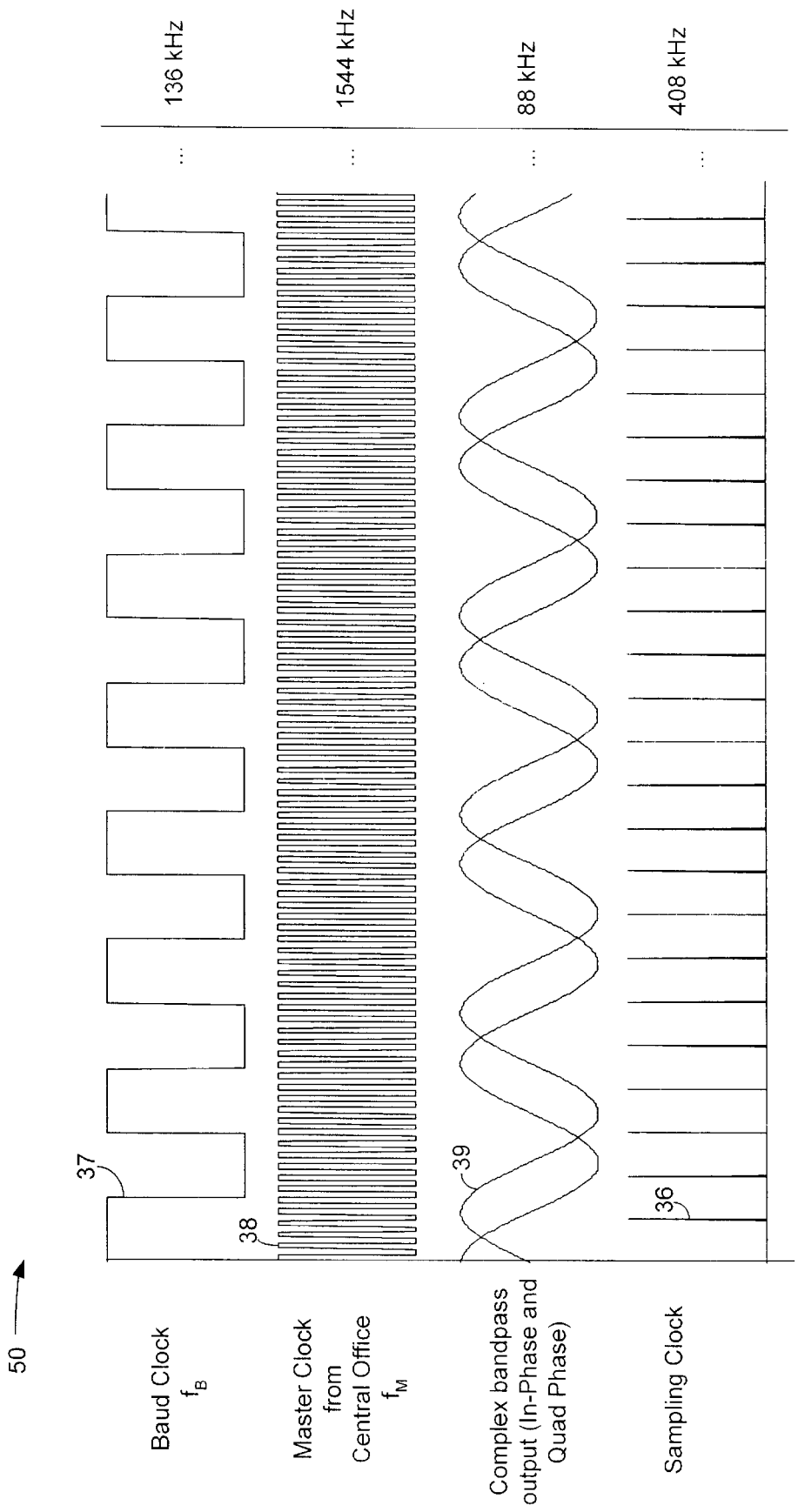
FIG. 6 is a graphical representation of a network clock sampling cycle of the transceiver of FIG. 2.

Referring now to FIG. 6, shown is a graphical representation of the operation of the external timing system and a complex rotator of FIG. 2. Trace 36 represents the sampling/processing clock, in this preferred embodiment operating at a frequency of 408 kHz. Trace 37 represents the system baud clock, $f_B$, operating at a frequency of 136 kHz. Note that the sampling clock operates at a frequency that is three times that of the baud clock. Trace 38 represents the master clock from the central office, in this preferred embodiment at a frequency of 1544 kHz, i.e. a T-1 network clock, represented as $f_M$. Trace 39 represents the complex bandpass output (in-phase and quadrature phase) as output from complex bandpass filter 53, and in this preferred embodiment is at a frequency rate of 88 kHz. In the case of a frequency offset between the output of complex bandpass filter 53, i.e., $y_n$ represented as signal 54 and the output of complex generator 68, i.e. complex rotator 67, the resulting phase vector represented as the output of demodulator 56, i.e. signal 57 will rotate. The update of frequency synthesizing device 61 through loop filter 58 will synchronize the system to the external clock. If the system is synchronized, output 57 will be a steady state vector with zero phase.

Figures 7A, 7B:
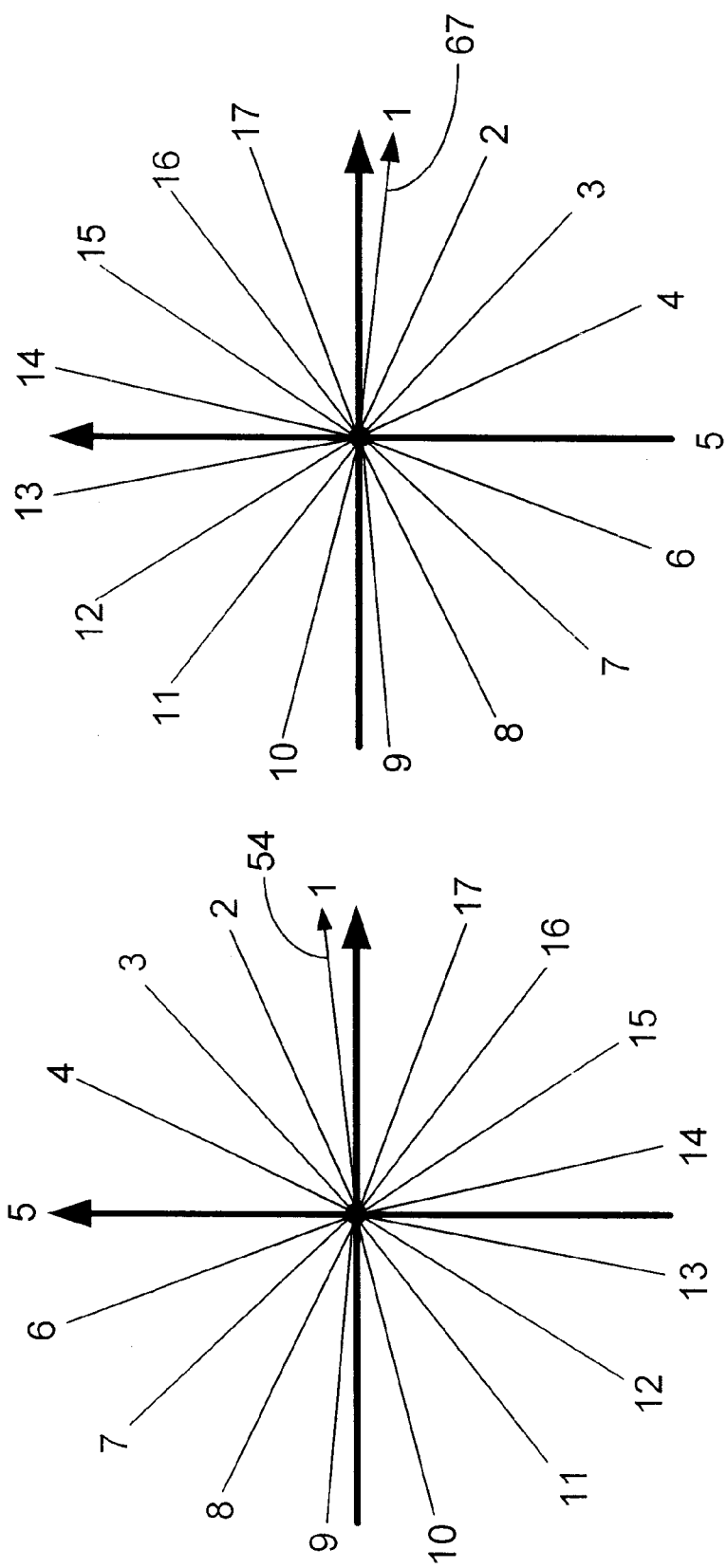
FIGS. 7A and 7B are a graphical representation of the vector rotation that occurs in the sampling window of FIG. 6.

Referring now to FIGS. 7A and 7B, graphically represented is the phase output of complex bandpass filter 53 and the phase output of complex generator 68 respectively. Note that the phase of the output of filter 53, represented by signal 54, is opposite, or canceled by the phase of the output of complex generator 68, represented by complex rotator output 67, thus ensuring that output 57 is a steady state vector having zero phase, thus indicating that the system clock is synchronized to the external clock.

In the preceeding example, $f_M$=1544 KHz, $f_B$=136 KHz, and L=3.

$$fM = \left| fM - \left\lfloor \frac{fM}{LfB} + \frac{1}{2} \right\rfloor \cdot L \cdot fB \right|,$$

where $f_M$=136 KHz, and L=3.

$$\left| fM - \left\lceil \frac{fM}{L \cdot fB} \right\rceil \cdot L \cdot fB \right|,$$

and where $f_M$ is the internal master clock after sampling the central office master clock $f_M$ at a rate of $L*f_B$. ⌈ ⌉ denotes the next higher integer.

It will be obvious to those skilled in the art that many modifications and variations may be made to the preferred embodiments of the present invention, as set forth above, without departing substantially from the principles of the present invention. For example, a VCO or VDL can be used as the frequency synthesizing device. All such modifications and variations are intended to be included herein within the scope of the present invention, as defined in the claims that follow.

Therefore, the following is claimed:

1. A system for providing external timing, comprising:
    a filter configured to receive a sampled clock signal input and to provide a two dimensional multilevel signal output, said clock signal input sampled at a particular rate;
    a demodulator configured to multiply said two dimensional multilevel signal output with a complex rotation signal and provide a phase error signal output;
    a loop filter configured to receive said phase error signal and output a real voltage signal;
    a frequency synthesizing device configured to supply an input to a system clock, said system clock configured to output a sampling clock signal and a baud clock signal; and
    a complex generator configured to receive as input said sampling clock signal and provide as output a complex rotation signal designed to control said demodulator.

2. The system of claim 1, further comprising a multiplier configured to multiply said clock signal input to a rate that is integer related to that of said input clock.

3. The system of claim 1, further comprising a divider configured to divide said clock signal input to a rate that is integer related to that of said input clock.

4. The system of claim 1, wherein said clock signal input is at a standard rate.

5. A system for synchronizing a transceiver to a network clock, comprising:
    means for receiving a clock signal input, said means configured to provide a complex two dimensional multilevel signal output;
    means for multiplying said complex two dimensional multilevel signal with a complex rotation signal, said means for multiplying configured to output a phase error signal;
    means for receiving said phase error signal and supplying a real voltage signal; and
    means for supplying said complex rotation signal.

6. The system of claim 5, further comprising a multiplier configured to multiply said clock signal input to a rate that is integer related to that of said input clock.

7. The system of claim 5, further comprising a divider configured to divide said clock signal input to a rate that is integer related to that of said input clock.

8. The system of claim 5, wherein said clock signal input is at a standard rate.

9. A method for providing external timing, comprising the steps of:
    supplying to a complex filter a sampled clock signal input, said complex filter configured to receive and to provide a two dimensional multilevel signal output, said clock signal input sampled at a particular rate;
    demodulating, in a demodulator, said two dimensional multilevel signal output with a complex rotation signal resulting in a phase error signal output;
    filtering said phase error signal resulting in a real voltage signal;
    supplying said complex rotation signal to said demodulator, said complex rotation signal designed to control said demodulator; and
    receiving said complex rotation signal in a system clock, said system clock configured to supply a sampling clock signal and a baud clock signal.

10. The method of claim 9, further comprising the step of multiplying said clock signal input to a rate that is integer related to that of said input clock.

11. The method of claim 9, further comprising the step of dividing said clock signal input to a rate that is integer related to that of said input clock.

12. The method of claim 9, wherein said clock signal input is at a standard rate.

13. A computer readable medium having a program for providing external timing, the program comprising:
    means for supplying to a complex filter a sampled clock signal input, said complex filter configured to receive and to provide a two dimensional multilevel signal output, said clock signal input sampled at a particular rate;
    means for demodulating, in a demodulator, said two dimensional multilevel signal output with a complex rotation signal resulting in a phase error signal output;
    means for filtering said phase error signal resulting in a real voltage signal;
    means for supplying said complex rotation signal to said demodulator, said complex rotation signal designed to control said demodulator; and
    means for receiving said complex rotation signal in a system clock, said system clock configured to supply a sampling clock signal and a baud clock signal.

14. The program of claim 13, further comprising means for multiplying said clock signal input to a rate that is integer related to that of said input clock.

15. The program of claim 13, further comprising means for dividing said clock signal input to a rate that is integer related to that of said input clock.

16. The program of claim 13, wherein said clock signal input is at a standard rate.

* * * * *